United States Patent
Hareland et al.

(10) Patent No.: US 7,714,397 B2
(45) Date of Patent: May 11, 2010

(54) TRI-GATE TRANSISTOR DEVICE WITH STRESS INCORPORATION LAYER AND METHOD OF FABRICATION

(75) Inventors: Scott A. Hareland, Tigard, OR (US); Robert S. Chau, Beaverton, OR (US); Brian S. Doyle, Portland, OR (US); Suman Datta, Beaverton, OR (US); Been-Yih Jin, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 11/493,789

(22) Filed: Jul. 25, 2006

(65) Prior Publication Data

US 2006/0261411 A1 Nov. 23, 2006

Related U.S. Application Data

(60) Division of application No. 11/173,443, filed on Jun. 30, 2005, now Pat. No. 7,241,653, which is a continuation of application No. 10/834,717, filed on Apr. 28, 2004, now Pat. No. 6,974,738, which is a division of application No. 10/607,632, filed on Jun. 27, 2003, now Pat. No. 6,909,151.

(51) Int. Cl.
  *H01L 29/06* (2006.01)
(52) U.S. Cl. ............... 257/401; 257/623; 257/E29.022
(58) Field of Classification Search ............... 257/401, 257/618, 623, E29.022
  See application file for complete search history.

(56) References Cited

U.S. PATENT DOCUMENTS

| | | | |
|---|---|---|---|
| 4,231,149 A | 11/1980 | Chapman et al. | |
| 4,487,652 A | 12/1984 | Almgren | |
| 4,818,715 A | 4/1989 | Chao | |
| 4,905,063 A | 2/1990 | Beltram et al. | |
| 4,906,589 A | 3/1990 | Chao | |
| 4,907,048 A | 3/1990 | Huang | |
| 4,994,873 A | 2/1991 | Madan | |
| 4,996,574 A | 2/1991 | Shirasaki | |
| 5,124,777 A | 6/1992 | Lee | |
| 5,179,037 A | 1/1993 | Seabaugh | |

(Continued)

FOREIGN PATENT DOCUMENTS

| | | |
|---|---|---|
| DE | 102 03 9978 A1 | 8/2003 |
| EP | 0 623 963 A1 | 11/1994 |
| EP | 1 202 335 A2 | 5/2002 |
| EP | 1 566 844 A2 | 8/2005 |
| GB | 2 156 149 | 10/1985 |

(Continued)

OTHER PUBLICATIONS

Ludwig, T. et al., "FinFET Technology for Future Microprocessors", 2003 IEEE, pp. 33-34.

(Continued)

*Primary Examiner*—Marcos D. Pizarro
(74) *Attorney, Agent, or Firm*—Blakely, Sokoloff, Taylor & Zafman LLP

(57) ABSTRACT

A semiconductor device comprising a semiconductor body having a top surface and laterally opposite sidewalls is formed on an insulating substrate. A gate dielectric layer is formed on the top surface of the semiconductor body and on the laterally opposite sidewalls of the semiconductor body. A gate electrode is formed on the gate dielectric on the top surface of the semiconductor body and is formed adjacent to the gate dielectric on the laterally opposite sidewalls of the semiconductor body. A thin film is then formed adjacent to the semiconductor body wherein the thin film produces a stress in the semiconductor body.

15 Claims, 7 Drawing Sheets

U.S. PATENT DOCUMENTS

| | | | |
|---|---|---|---|
| 5,216,271 A | 6/1993 | Takagi et al. | |
| 5,338,959 A | 8/1994 | Kim et al. | |
| 5,346,839 A | 9/1994 | Sundaresan | |
| 5,391,506 A | 2/1995 | Tada et al. | |
| 5,466,621 A | 11/1995 | Hisamoto et al. | |
| 5,521,859 A | 5/1996 | Ema et al. | |
| 5,543,351 A | 8/1996 | Yoshihiko et al. | |
| 5,545,586 A | 8/1996 | Koh et al. | |
| 5,563,077 A | 10/1996 | Ha et al. | |
| 5,578,513 A | 11/1996 | Maegawa | |
| 5,595,919 A | 1/1997 | Pan | |
| 5,658,806 A | 8/1997 | Lin et al. | |
| 5,698,869 A | 12/1997 | Yoshimi et al. | |
| 5,701,016 A | 12/1997 | Burroughs et al. | |
| 5,716,879 A | 2/1998 | Choi et al. | |
| 5,739,544 A | 4/1998 | Koichiro et al. | |
| 5,760,442 A | 6/1998 | Shigyo et al. | |
| 5,770,513 A | 6/1998 | Okaniwa | |
| 5,773,331 A | 6/1998 | Solomon et al. | |
| 5,793,088 A | 8/1998 | Choi et al. | |
| 5,804,848 A | 9/1998 | Mukai | |
| 5,814,895 A | 9/1998 | Hirayama et al. | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,880,015 A | 3/1999 | Hata | |
| 5,888,309 A | 3/1999 | Yu | |
| 5,889,304 A | 3/1999 | Watanabe et al. | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea et al. | |
| 6,013,926 A | 1/2000 | Oku et al. | |
| 6,018,176 A | 1/2000 | Lim | |
| 6,051,452 A | 4/2000 | Shigyo et al. | |
| 6,054,355 A | 4/2000 | Inumiya et al. | |
| 6,066,869 A | 5/2000 | Noble et al. | |
| 6,087,208 A | 7/2000 | Krivokapic et al. | |
| 6,093,621 A | 7/2000 | Tseng | |
| 6,117,741 A | 9/2000 | Chatterjee et al. | |
| 6,153,485 A | 11/2000 | Pey et al. | |
| 6,163,053 A | 12/2000 | Kawashima | |
| 6,165,880 A | 12/2000 | Yaung et al. | |
| 6,218,309 B1 | 4/2001 | Miller et al. | |
| 6,251,729 B1 | 6/2001 | Montree et al. | |
| 6,251,763 B1 | 6/2001 | Inumiya et al. | |
| 6,252,284 B1 | 6/2001 | Muller et al. | |
| 6,261,921 B1 | 7/2001 | Yen et al. | |
| 6,294,416 B1 | 9/2001 | Wu | |
| 6,307,235 B1 | 10/2001 | Forbes et al. | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,376,317 B1 | 4/2002 | Forbes et al. | |
| 6,383,882 B1 | 5/2002 | Lee et al. | |
| 6,391,782 B1 | 5/2002 | Yu | |
| 6,396,108 B1 | 5/2002 | Krivokapic et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,459,123 B1 | 10/2002 | Enders et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,483,156 B1 | 11/2002 | Adkisson et al. | |
| 6,498,096 B2 | 12/2002 | Bruce et al. | |
| 6,506,692 B2 | 1/2003 | Andideh | |
| 6,525,403 B2 | 2/2003 | Inaba et al. | |
| 6,534,807 B2 | 3/2003 | Mandelman et al. | |
| 6,537,885 B1 | 3/2003 | Kang et al. | |
| 6,537,901 B2 | 3/2003 | Cha et al. | |
| 6,541,829 B2 | 4/2003 | Nishinohara et al. | |
| 6,562,665 B1 | 5/2003 | Yu | |
| 6,562,687 B1 | 5/2003 | Deleonibus et al. | |
| 6,583,469 B1 | 6/2003 | Fried et al. | |
| 6,605,498 B1 | 8/2003 | Murthy et al. | |
| 6,610,576 B2 | 8/2003 | Nowak | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,645,797 B1 | 11/2003 | Buynoski et al. | |
| 6,645,826 B2 | 11/2003 | Yamazaki et al. | |
| 6,645,861 B2 | 11/2003 | Cabral et al. | |
| 6,656,853 B2 | 12/2003 | Ito | |
| 6,657,259 B2 | 12/2003 | Fried et al. | |
| 6,660,598 B2 | 12/2003 | Hanafi et al. | |
| 6,664,160 B2 | 12/2003 | Park et al. | |
| 6,680,240 B1 | 1/2004 | Maszara | |
| 6,689,650 B2 | 2/2004 | Gambino et al. | |
| 6,693,324 B2 | 2/2004 | Maegawa et al. | |
| 6,696,366 B1 | 2/2004 | Morey et al. | |
| 6,706,571 B1 | 3/2004 | Yu et al. | |
| 6,709,982 B1 | 3/2004 | Buynoski et al. | |
| 6,713,396 B2 | 3/2004 | Anthony | |
| 6,716,684 B1 | 4/2004 | Krivokapic et al. | |
| 6,716,690 B1 | 4/2004 | Wang et al. | |
| 6,730,964 B2 | 5/2004 | Horiuchi | |
| 6,744,103 B2 | 6/2004 | Snyder | |
| 6,756,657 B1 | 6/2004 | Zhang et al. | |
| 6,764,884 B1 | 7/2004 | Yu et al. | |
| 6,770,516 B2 | 8/2004 | Wu et al. | |
| 6,774,390 B2 | 8/2004 | Sugiyama et al. | |
| 6,787,402 B1 | 9/2004 | Yu | |
| 6,787,439 B2 | 9/2004 | Ahmed et al. | |
| 6,787,845 B2 | 9/2004 | Deleonibus | |
| 6,787,854 B1 | 9/2004 | Yang et al. | |
| 6,790,733 B1 | 9/2004 | Natzle et al. | |
| 6,794,313 B1 | 9/2004 | Chang | |
| 6,794,718 B2 | 9/2004 | Nowak et al. | |
| 6,798,000 B2 | 9/2004 | Luyken et al. | |
| 6,800,855 B1 | 10/2004 | An et al. | |
| 6,800,910 B2 | 10/2004 | Lin et al. | |
| 6,803,631 B2 | 10/2004 | Dakshina-Murthy et al. | |
| 6,812,075 B2 | 11/2004 | Fried et al. | |
| 6,812,111 B2 | 11/2004 | Cheong et al. | |
| 6,815,277 B2 | 11/2004 | Fried et al. | |
| 6,821,834 B2 | 11/2004 | Ando | |
| 6,825,506 B2 | 11/2004 | Chau et al. | |
| 6,833,588 B2 | 12/2004 | Yu et al. | |
| 6,835,614 B2 | 12/2004 | Hanafi et al. | |
| 6,835,618 B1 | 12/2004 | Dakshina-Murthy et al. | |
| 6,838,322 B2 | 1/2005 | Pham et al. | |
| 6,844,238 B2 | 1/2005 | Yeo et al. | |
| 6,849,884 B2 | 2/2005 | Clark et al. | |
| 6,852,559 B2 | 2/2005 | Kwak et al. | |
| 6,855,990 B2 | 2/2005 | Yeo et al. | |
| 6,858,478 B2 | 2/2005 | Chau et al. | |
| 6,867,433 B2 | 3/2005 | Yeo et al. | |
| 6,867,460 B1 | 3/2005 | Anderson et al. | |
| 6,869,868 B2 | 3/2005 | Chiu et al. | |
| 6,869,898 B2 | 3/2005 | Chiu et al. | |
| 6,884,154 B2 | 4/2005 | Mizushima et al. | |
| 6,885,055 B2 | 4/2005 | Lee | |
| 6,897,527 B2 | 5/2005 | Dakshina-Murthy et al. | |
| 6,921,691 B1 | 7/2005 | Li et al. | |
| 6,921,702 B2 | 7/2005 | Ahn et al. | |
| 6,921,963 B2 | 7/2005 | Krivokapic et al. | |
| 6,921,982 B2 | 7/2005 | Joshi et al. | |
| 6,924,190 B2 | 8/2005 | Dennison | |
| 6,960,517 B2 | 11/2005 | Rios et al. | |
| 6,967,351 B2 | 11/2005 | Fried et al. | |

| | | |
|---|---|---|
| 6,855,606 B2 | 12/2005 | Chen et al. |
| 6,974,738 B2 | 12/2005 | Hareland et al. |
| 7,018,551 B2 | 3/2006 | Beintner et al. |
| 7,045,401 B2 | 5/2006 | Lee et al. |
| 7,060,539 B2 | 6/2006 | Chidambarrao et al. |
| 7,061,055 B2 | 6/2006 | Sekigawa et al. |
| 7,070,064 B1 | 7/2006 | Doyle et al. |
| 7,074,623 B2 | 7/2006 | Lochtefeld et al. |
| 7,105,891 B2 | 9/2006 | Visokay et al. |
| 7,112,478 B2 | 9/2006 | Grupp et al. |
| 7,122,463 B2 | 10/2006 | Ohuchi |
| 7,141,856 B2 | 11/2006 | Lee et al. |
| 7,154,118 B2 | 12/2006 | Lindert |
| 7,163,851 B2 | 1/2007 | Adadeer et al. |
| 7,183,137 B2 | 2/2007 | Lee et al. |
| 7,187,043 B2 | 3/2007 | Arai et al. |
| 7,238,564 B2 | 7/2007 | Ko et al. |
| 7,241,653 B2 | 7/2007 | Hareland et al. |
| 7,250,645 B1 | 7/2007 | Wang et al. |
| 7,358,121 B2 | 4/2008 | Chau et al. |
| 2002/0011612 A1 | 1/2002 | Hieda |
| 2002/0036290 A1 | 3/2002 | Inaba et al. |
| 2002/0081794 A1 | 6/2002 | Ito |
| 2002/0166838 A1 | 11/2002 | Nagarajan |
| 2002/0167007 A1 | 11/2002 | Yamazaki et al. |
| 2003/0042542 A1 | 3/2003 | Maegawa et al. |
| 2003/0057468 A1 | 3/2003 | Gambino et al. |
| 2003/0057486 A1 | 3/2003 | Gambino |
| 2003/0067017 A1 | 4/2003 | Leong et al. |
| 2003/0085194 A1 | 5/2003 | Hopkins, Jr. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0201458 A1 | 10/2003 | Clark et al. |
| 2003/0227036 A1 | 12/2003 | Sugiyama et al. |
| 2004/0031979 A1* | 2/2004 | Lochtefeld et al. .......... 257/233 |
| 2004/0033639 A1 | 2/2004 | Chinn et al. |
| 2004/0036118 A1 | 2/2004 | Adadeer et al. |
| 2004/0036126 A1 | 2/2004 | Chau et al. |
| 2004/0036127 A1 | 2/2004 | Chau et al. |
| 2004/0061178 A1 | 4/2004 | Lin et al. |
| 2004/0070020 A1 | 4/2004 | Fujiwara et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1* | 5/2004 | Yeo et al. .................... 257/317 |
| 2004/0099966 A1 | 5/2004 | Chau et al. |
| 2004/0110097 A1 | 6/2004 | Ahmed et al. |
| 2004/0119100 A1 | 6/2004 | Nowak et al. |
| 2004/0126975 A1 | 7/2004 | Ahmed et al. |
| 2004/0132236 A1 | 7/2004 | Doris et al. |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0203254 A1 | 10/2004 | Conley et al. |
| 2004/0217420 A1 | 11/2004 | Yeo et al. |
| 2004/0219780 A1 | 11/2004 | Ohuchi |
| 2004/0227187 A1 | 11/2004 | Cheng et al. |
| 2004/0238887 A1 | 12/2004 | Nihey |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0019993 A1 | 1/2005 | Lee et al. |
| 2005/0035415 A1 | 2/2005 | Yeo et al. |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0118790 A1 | 6/2005 | Lee et al. |
| 2005/0127362 A1 | 6/2005 | Zhang et al. |
| 2005/0133866 A1 | 6/2005 | Chau et al. |
| 2005/0139860 A1 | 6/2005 | Snyder et al. |
| 2005/0145941 A1 | 7/2005 | Bedell et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0167766 A1 | 8/2005 | Yagishita |
| 2005/0184316 A1 | 8/2005 | Kim |
| 2005/0215022 A1 | 9/2005 | Adam et al. |
| 2005/0224797 A1 | 10/2005 | Ko et al. |
| 2005/0224800 A1 | 10/2005 | Lindert |
| 2005/0227498 A1 | 10/2005 | Furkawa |
| 2005/0230763 A1 | 10/2005 | Huang et al. |
| 2005/0233156 A1 | 10/2005 | Senzaki et al. |
| 2005/0272192 A1 | 12/2005 | Oh et al. |
| 2005/0277294 A1 | 12/2005 | Schaeffer et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0154478 A1 | 7/2006 | Hsu et al. |
| 2007/0093010 A1 | 4/2007 | Mathew et al. |
| 2007/0108514 A1 | 5/2007 | Inoue et al. |

FOREIGN PATENT DOCUMENTS

| | | | |
|---|---|---|---|
| JP | | 59 145538 A | 8/1984 |
| JP | | 02-303048 A | 12/1990 |
| JP | | 06177089 | 6/1994 |
| JP | | 06224440 A | 8/1994 |
| JP | | 09162301 A | 6/1997 |
| JP | | 200037842 A | 2/2000 |
| JP | | 2003298051 | 10/2003 |
| TW | | 516232 | 1/2003 |
| TW | | 548799 | 8/2003 |
| TW | | 561530 | 11/2003 |
| TW | | 200402872 A | 2/2004 |
| TW | | 200405408 A | 4/2004 |
| WO | WO 02/43151 A1 | | 5/2002 |
| WO | WO 2004/059726 A1 | | 7/2004 |

OTHER PUBLICATIONS

Yang-Kyu Choi et al., "Sub-20nm CMOS FinFET Technologies", IEEE 2001, IEDM 01-421 to 01-424.

Ieong, M. et al. "Three Dimensional CMOS Devices and Integrated Circuits", IEEE 2003, Custom Integrated Circuits Conference, San Jose, CA, Sep. 21-24, 2003, pp. 207-214.

Jones, E.C., "Doping Challenges in Exploratory Devices for High Performance Logic", 14th International Conference, Piscataway, NJ, Sep. 22-27, 2002, pp. 1-6.

Chang, Leland et al., "CMOS Circuit Performance Enhancement by Surface Orientation Optimization", IEEE Transactions of Electron Devices, vol. 51, No. 10, Oct. 2004, pp. 1621-1627.

European Patent Office, Patent Abstracts of Japan, "Semiconductor Integrated Circuit Device", Publication No. 59145538, Publication Date: Aug. 21, 1984, Hitachi Ltd., 4 pages.

PCT International Search Report and Written Opinion for PCT/US2006/024516, mailed Jan. 17, 2007, 18 pages.

Stadele, M. et al., "A Comprehensive Study of Corner Effects in Tri-gate Transistors", IEEE, ISBN: 0-7803-8478-4, Solid-State Device Research Conference, Sep. 21, 2004, pp. 165-168.

PCT International Search Report and Written Opinion for PCT/US2006/037643, mailed Jan. 24, 2007, 4 pages.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.

R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (14 pgs.).

Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

PCT Notification of Transmittal of The International Search Report or The Declaration for PCT Counterpart Application No. PCT/US03/39727 Containing International Search Report (Apr. 27, 2004).

PCT Notification of Transmittal of The International Search Report or The Declaration for PCT Counterpart Application No. PCT/US03/26242 Containing International Search Report (Jan. 26, 2004).

PCT Notification of Transmittal of The International Search Report or The Declaration for PCT Counterpart Application No. PCT/US03/40320 Containing International Search Report (Jun. 2, 2004).

PCT Notification of Transmittal of The International Search Report and The Written Opinion of the International Searching Authority, or The Declaration for PCT Counterpart Application No. PCT/US05/000947 Containing International Search Report (May 3, 2005).

V. Subramanian et al., "A Bulk-Si-Compatible Ultrathin-body SOI Technology for Sub-100m MOSFETS" Proceeding of the 57th Annual Device Research Conference, pp. 28-29 (1999).

Hisamoto et al., "A Folded-channel MOSFET for Deepsub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)-A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

Jing Guo, et al., "Performance projections for baliistic carbon nanotube field-effect transistors," Applied Physics Letters, vol. 80, No. 17, pp. 3192-3194 (Apr. 29, 2002).

Ali Javey, et al., "High-k dielectrics for advanced carbon-nanotube transistors and logic gates," Advance Online Publication, Published online, pp. 1-6 (Nov. 17, 2002).

Richard Martel, et al., "Carbon Nonotube Field Effect Transistors for Logic Applications," IBM, T.J. Watson Research Center, 2001 IEEE, IEDM 01-159 -162, 4 pp.

Fried, David M. et al., High-Performance P-Type Independent-Gate FinFETs, IEEE Electron Device Letters, vol. 25, No. 4, Apr. 2004, pp. 199-201.

Fried, David M. et al., Improved Independent Gate N-Type FinFET Fabrication and Characterization, IEEE Electron Device Letters, vol. 24, No. 9, Sep. 2003, pp. 592-594.

Kuo, Charles et al., A Capacitorless Double Gate DRAM Technology for Sub-100-nm Embedded and Stand-Alone Memory Applications, IEEE Transactions on Electron Devices, vol. 50, No. 12, Dec. 2003, pp. 2408-2416.

Kuo, Charles et al., A Capacitorless Double-Gate DRAM Cell Design for High Density Applications, 2002 IEEE International Electron Devices Meeting Technical Digest, Dec. 2002, pp. 843-846.

Ohsawa, Takashi et al., Memory Design Using a One-Transistor Gain Cell on SOI, IEEE Journal of Solid-State Circuits, vol. 37, No. 11, Nov. 2002, pp. 1510-1522.

Tanaka, T. et al., Scalability Study on a Capacitorless 1T-DRAM: From Single-gate PD-SOI to Double-gate FinDRAM, 2004 IEEE International Electron Devices Meeting Technical Digest, Dec. 2004, 4 pages.

PCT International Search Report PCT/US2005/020339, Mailed Oct. 4, 2005.

T. Park et al., "Fabrication of Body-Tied FinFETs (Omega MOSFETs) Using Bulk Si Wafers," 2003 Symposium on VLSI Technology Digest of Technical Papers, pp. 135-136, Jun. 2003.

PCT Notification of Transmittal of the International Search Report and the Written Opinion of the International Searching Authority, or the Declaration for PCT Counterpart Application No. PCT/US05/010505 Containing International Search Report, Aug. 26, 2005.

S.T. Chang et al., "3-D Simulation of Strained Si/SiGe Heterojunction FinFETs," XP010687197, Semiconductor Device Research Symposium, 2003 International, pp. 176-177, Dec. 10, 2003.

A. Burenkov et al., "Corner Effect in Double and Triple Gate FinFETs," XP01067616, 2003 European Solid-State Device Research on Essderc, pp. 135, Sep. 16, 2003.

Office Action mailed on Jul. 20, 2006, regarding U.S. Appl. No. 11/173,443, filed Jun. 30, 2005.

International Search Report PCT/US2005/020339.

International Search Report PCT/US2004/032442.

International Search Report and Written Opinion PCT/US2006/000378.

Peter A. Stolk et al. "Modeling Statistical Dopant Fluctuations in MOS Transistors", 1998 IEEE, IEEE Transactions on Electron Devices, vol. 45, No. 9, Sep. 1987, pp. 1960-1971.

Evert Seevinck et al., "Static-Noise Margin Analysis of MOS SRAM Cells" 1987 IEEE, IEEE Journals of Solid-State Circuits, vol. SC-22, No. 5, Oct. 1987.

E.J. Nowak et al., "Scaling Beyond the 65nm Node with FinFET-DGCMOS", IEEE 2003, CICC, San Jose, CA, Sep. 21-24, 2003, pp. 339-342.

T. Park et al. "PMOS Body-Tied FinFET (Omega MOSFET) Characteristics", Device Research Conference, Piscataway, NJ, Jun. 23-25, 2003, IEEE, pp. 33-34.

E.J. Nowak et al., "A Functional FinFET-DGCMOS SRAM Cell", International Electron Devices Meeting 2002, San Francisco, CA, Dec. 8-11, 2002, pp. 411-414.

Jae-Hyoun Park, "Quantum-wired MOSFET Photodetector Fabricated by Conventional Photolithography on SOI Substrate", Nanotechnology, 2004, 4$^{th}$ IEEE Conference on Munich, Germany, Aug. 16-19, 2004, Piscataway, NJ, pp. 425-427, XP010767302.

Ali Javey et al., "Ballistic Carbon Nanotube Field-Effect Transistors", Nature, vol. 424, Aug. 7, 2003, pp. 654-657.

R. Chau et al., Advanced Depleted-Substrate Transistors: Single-Gate, Double-Gate and Tri-gate (Invited Paper), Components Research, Logic Technology Development, Intel Corporation, Hillsboro OR, 2 pages.

* cited by examiner

TRI-GATE TRANSISTOR DEVICE WITH STRESS INCORPORATION LAYER AND METHOD OF FABRICATION

CROSS-REFERENCE TO RELATED APPLICATIONS

This is a Divisional Application of, and claims priority to, Ser. No. 11/173,443 filed on Jun. 30, 2005 now U.S. Pat. No. 7,241,653, which is a Continuation Application of, and claims priority to, Ser. No. 10/834,717 filed on Apr. 28, 2004, which issued on Dec. 13, 2005 as U.S. Pat. No. 6,974,738 and which is a Divisional Application of, and claims priority to, Ser. No. 10/607,632 filed on Jun. 27, 2003, which was issued on Jun. 21, 2005 as U.S. Pat. No. 6,909,151.

BACKGROUND OF THE INVENTION

1. Field of the Invention

The present invention relates to the field of semiconductor integrated circuit manufacturing and more specifically to a non-planar transistor having stress incorporation layer.

2. Discussion of Related Art

In order to increase device performance, silicon on insulator (SOI) transistors have been proposed for the fabrication of modern integrated circuits. FIG. 1 illustrates a standard fully depleted silicon on insulator (SOI) transistor 100. SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 formed on the gate dielectric 108. Source 112 and drain 114 regions are formed in the silicon body 106 along laterally opposite sides of gate electrode 110.

Fully depleted SOI have been proposed as a transistor structure to take advantage of ideal sub-threshold gradients for optimized on current/off current ratios. In order to achieve ideal subthreshold gradients with transistor 100, the thickness of the silicon body 106 must be about ⅓ the size of the gate length (Lg) of the transistor or $Tsi=Lg/3$. However, as gate lengths scale especially as they approach 30 nm, the need for ever decreasing silicon film thickness (Tsi) makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202.

Double gate (DG) device 200 essentially has two gates, one on either side of the channel of the device. Because the double gate device 200 has a gate on each side of the channel, thickness (Tsi) of the silicon body can be double that of a single gate device and still obtain a fully depleted transistor operation. That is, with a double gate device 200 a fully depleted transistor can be formed where $Tsi=(2\times Lg)/3$. The most manufacturable form of the double gate (DG) device 200, however, requires that the body 202 patterning be done with photolithography that is 0.7× smaller than that used to pattern the gate length (Lg) of the device. In order to obtain high density integrated circuits, it is generally desirable to have the most aggressive lithography occur with respect to the gate length (Lg) of the gate electrode 208. Although, double gate structures double the thickness of the silicon film (since there now is a gate on either side of the channel) these structures, however, are hideously difficult to fabricate. For example, silicon body 202 requires a silicon body etch which can produce a silicon body 202 with an aspect ratio (height to width) of about 5:1.

DETAILED DESCRIPTION OF THE PRESENT INVENTION

Figure 1:
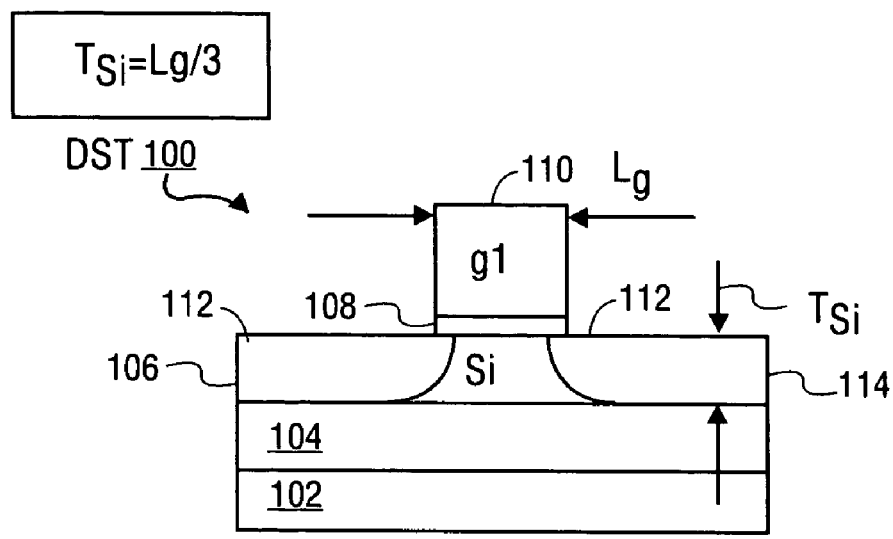
FIG. 1 is an illustration of a cross-sectional view of a depleted substrate transistor.
Figure 2A:
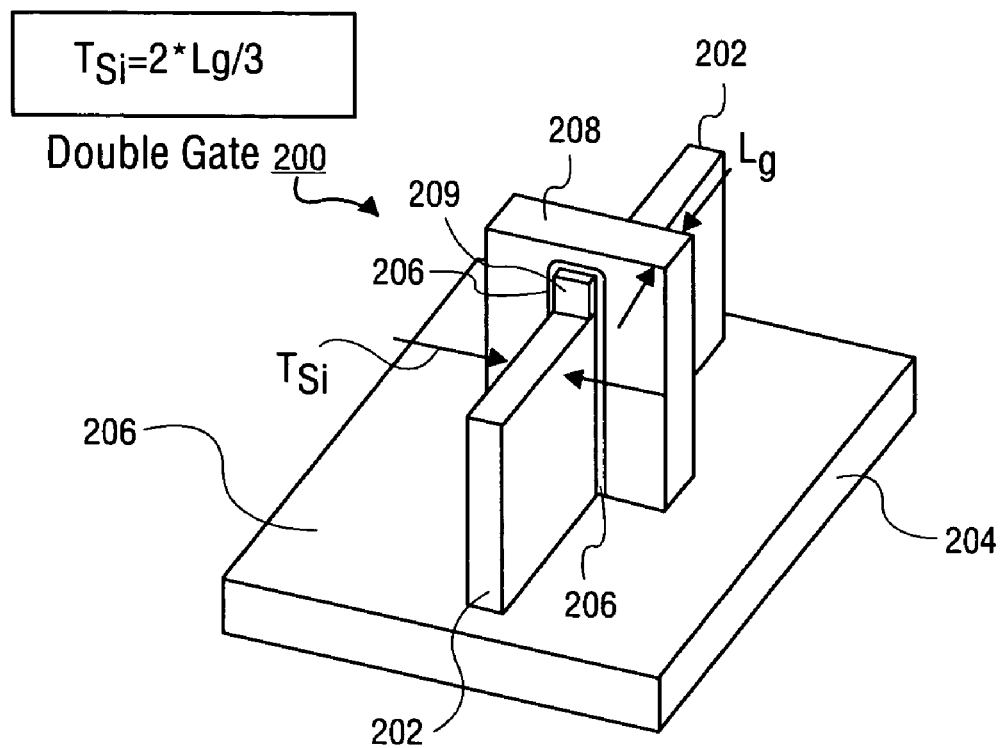
FIGS. 2A and 2B illustrate a double gate depleted substrate transistor.
Figure 2B:
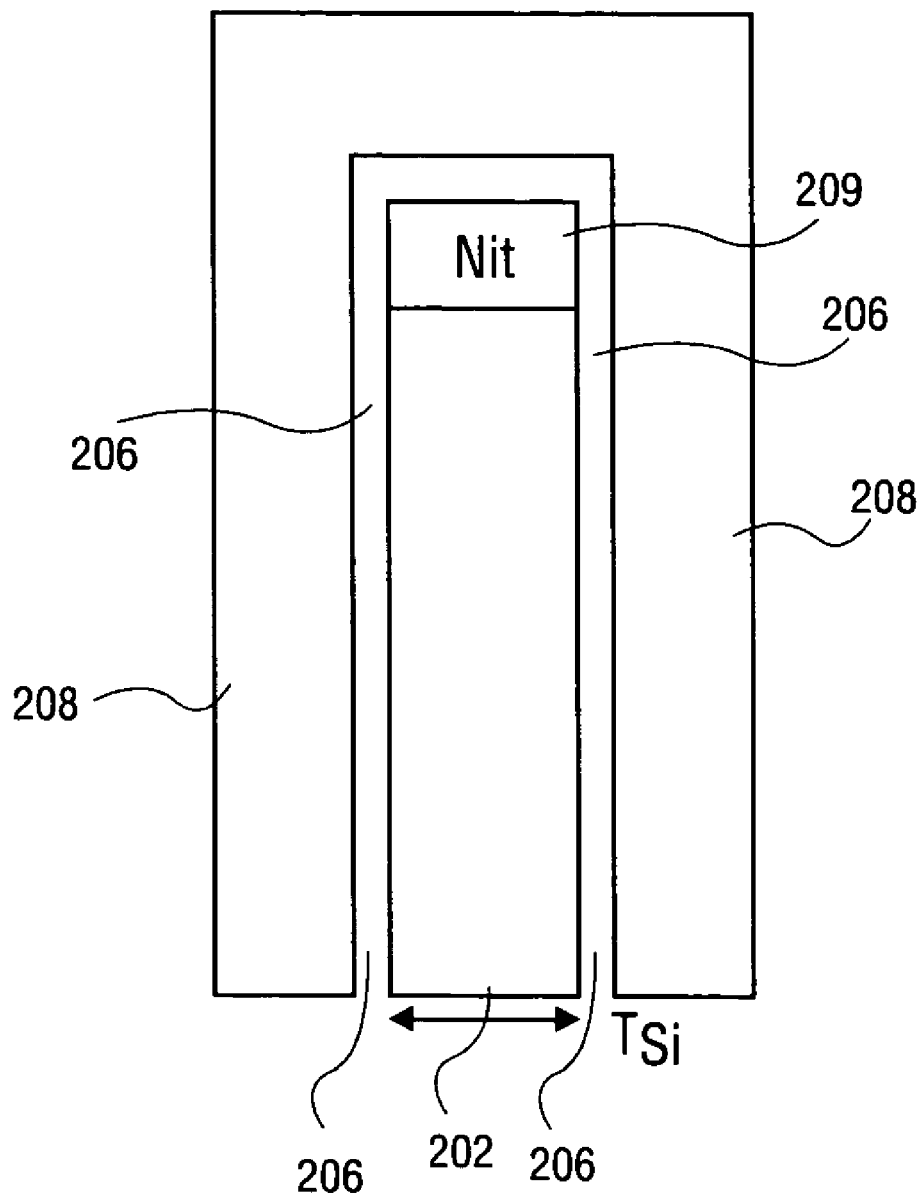

The present invention is a novel tri-gate or non-planar transistor structure with a stress incorporating layer and its method of fabrication. In the following description numerous specific details are set forth in order to provide a thorough understanding in the present invention. In other instances, well-known semiconductor process and manufacturing techniques have not been described in particular detail in order to not unnecessarily obscure the present invention.

The present invention is novel non-planar or tri-gate transistor structure and its method of fabrication. The tri-gate transistor includes a stress film formed around the channel region of the device to provides a stress to the channel region to improve carrier mobility. Greater carrier mobility results in increased transistor drive current. In an embodiment of the present invention, the stress film is formed beneath the channel region so that it completely surrounds the channel. By completely surrounding the channel region with the stress film, the stress film provides stress to all sides of the channel, thereby providing stress over a large area and maximizing and improving device performance. The film stress properties, such a type of stress (i.e., compressive or tensile) and the amount of stress can be varied in order to optimize performance for different transistor types (e.g., PMOS and NMOS).

In an embodiment of the present invention, the tri-gate transistor is a semiconductor on insulator (SOI) transistor. The tri-gate transistor is ideal for use in fully depleted substrate transistor applications. The tri-gate transistor includes a thin semiconductor body formed on an substrate, the substrate can be an insulating substrate or a semiconductor substrate. A gate dielectric is formed on the top surface and the sidewalls of the semiconductor body. A gate electrode is formed on the gate dielectric on the top surface of the semiconductor body and is formed adjacent to the gate dielectric formed on the sidewalls of the semiconductor body. Source and drain regions are formed in the semiconductor body on opposite sides of the gate electrode. Because the gate electrode and the gate dielectric surround the semiconductor body on three sides, the transistor essentially has three separate channels and gates. The gate "width" of a transistor is equal to the sum of each of the three sides of the semiconductor body. Larger "width" transistors can be formed by connecting several tri-gate transistors together.

Because there are three separate channels formed in the semiconductor body, the semiconductor body can be fully depleted when the transistor is turned "ON", thereby enabling the formation of a fully depleted transistor with gate lengths of less than 30 nanometers without requiring the use of ultrathin semiconductor bodies or requiring photolithographic patterning of the semiconductor bodies to dimensions less than the gate length (Lg) of the device. That is, the structure of the tri-gate transistor of the present invention enables a fully depleted transistor to be fabricated where the thickness of the semiconductor body and width of the semiconductor body are equal to the gate length of the device. Because the novel tri-gate transistor of the present invention can be operated in a fully depleted manner, the device is characterized by ideal (i.e., very sharp) subthreshold slope and a reduced drain induced barrier lowering (DIBL) short channel effect of less than 100 mV/V and ideally about 60 mV/V which results in a lower leakage current when the device is turned "OFF" resulting in lower power consumption.

Figure 3A:
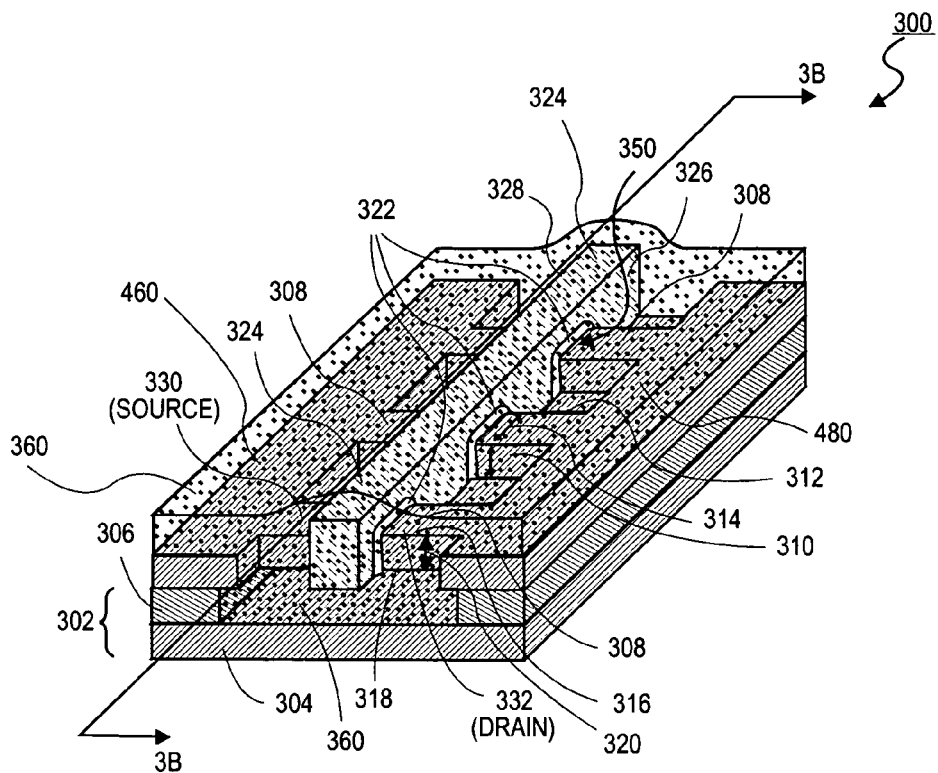
FIGS. 3A and 3B is an illustration of a tri-gate transistor having a stress incorporation film in accordance with the present invention.
Figure 3B:
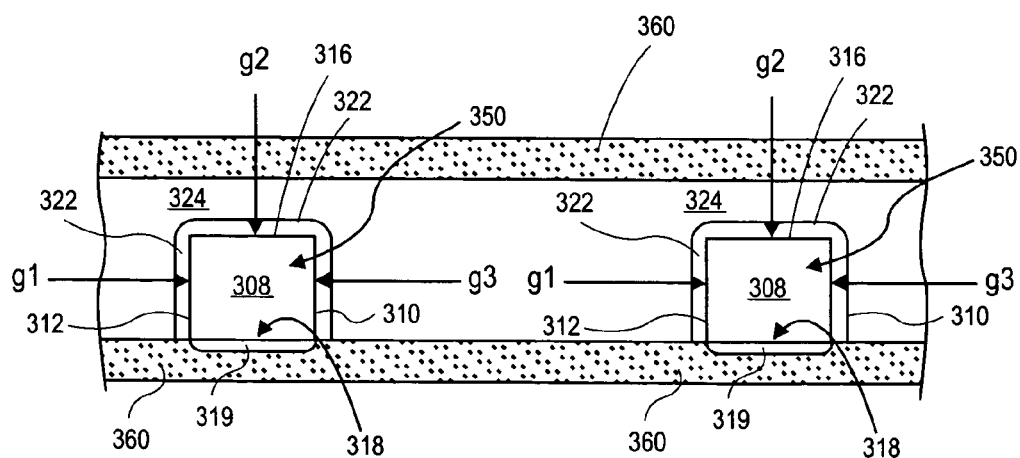

An example of a tri-gate transistor 300 with stress incorporation film in accordance with an embodiment of present invention as illustrated in FIGS. 3A and 3B. (FIG. 3B is a cross-sectional view of FIG. 3A taken through the gate electrode 324 of one of the semiconductor bodies 308.) Tri-gate transistor 300 is formed on an substrate 302. In an embodiment of the present invention, substrate 302 is an insulating substrate which includes a lower monocrystalline silicon substrate 304 upon which is formed in insulating layer 306, such as a silicon dioxide film. Tri-gate transistor 300, however, can be formed on any well-known insulating substrate such as substrates formed from silicon dioxide, nitrides, oxides, and sapphires. In an embodiment of the present invention, the substrate 302 can be a semiconductor substrate, such as but not limited to monocrystalline silicon substrate and gallium arsenide substrate.

Tri-gate transistor 300 includes a semiconductor body 308 and typically a plurality of semiconductor bodies 308 formed on insulator 306 of insulating substrate 302. Semiconductor body 308 can be formed of any well-known semiconductor material in which carrier mobility can be enhanced by applying a stress to the semiconductor, such as but not limited to silicon (Si) and silicon germanium ($Si_xGe_y$) where the Ge content is less than about 25%. Three-five (III-V) semiconductors, such as gallium arsenide (GaAs), InSb, GaP, and GaSb may also benefit from applying a stress to them. It is thought that direct band gap materials may not benefit from applying a stress thereto, while non-direct band gaps will benefit. Semiconductor body 308 is formed of a material which can be reversibly altered from an insulating state to a conductive state by applying external electrical controls. Semiconductor body 308 is ideally a single crystalline film when the best electrical performance of transistor 300, is desired. For example, semiconductor body 308 is a single crystalline film when transistor 300 is used in high performance applications, such as in a high density circuit, such as a microprocessor. Semiconductor body 308, however, can be a polycrystalline film when transistor 300 is used in applications requiring less stringent performance, such as in liquid crystal displays. Insulator 306 insulates semiconductor body 308 from monocrystalline silicon substrate 304. In an embodiment of the present invention, semiconductor body 308 is a single crystalline silicon film. Each semiconductor body or bodies 308 has a pair of laterally opposite sidewalls 310 and 312 separated by a distance which defines a semiconductor body width 314. Additionally, each semiconductor body 308 has a top surface 316 opposite a bottom surface 318 formed on substrate 302. The distance between the top surface 316 and the bottom surface 318 defines a body height 320. In an embodiment of the present invention the body height 320 is substantially equal to the body width 314. In an embodiment of the present invention, the body 308 has a width 314 and height 320 less than 30 nanometers and ideally less than 20 nanometers. In an embodiment of the present invention, the body height 320 is between ½ the body width 314 to 2 times the body width 314.

Tri-gate transistor 300 has a gate dielectric layer 322. Gate dielectric layer 322 is formed on and around three sides of each of the semiconductor bodies 308 as shown in FIGS. 3A and 3B. Gate dielectric layer 322 is formed on or adjacent to sidewall 312, on top surface 316 and on or adjacent to sidewall 310 of body 308 as shown in FIG. 3. Gate dielectric layer 322 can be any well-known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 322 is a silicon oxynitride film formed to a thickness of between 5-20 Å. In an embodiment of the present invention, gate dielectric layer 322 is a high K gate dielectric layer, such as a metal oxide dielectric, such as but not limited to tantalum pentaoxide ($Ta_2O_5$), titantium oxide ($TiO_2$), hafnium oxide ($HfO_2$), $HfSiO_xN_y$, zirconium oxide ($ZrO_2$) and lanthanum oxide $LaO_2$). Gate dielectric layer 322 can be other types of high K dielectricS, such as but not limited to PZT.

Tri-gate device 300 has a gate electrode 324. Gate electrode 324 is formed on and around gate dielectric layer 322 as shown in FIGS. 3A and 3B. Gate electrode 324 is formed on or adjacent to gate dielectric 322 formed on sidewall 312 of semiconductor body 308, is formed on gate dielectric 322 formed on the top surface 316 of semiconductor body 308, and is formed adjacent to or on gate dielectric layer 322 formed on sidewall 310 of semiconductor body 308. Gate electrode 324 has a pair of laterally opposite sidewalls 326 and 328 separated by a distance which defines the gate length (Lg) of transistor 300. In an embodiment of the present invention the laterally opposite sidewalls 326 and 328 of the gate electrode 324 run in a direction perpendicular to the laterally opposite sidewalls 310 and 312 of semiconductor body 308.

Gate electrode 324 can be formed of any suitable gate electrode material. In an embodiment of the present invention to gate electrode 324 comprises of polycrystalline silicon doped to a concentration density between $1\times10^{19}$ atoms/cm$^3$-$1\times10^{21}$ atoms/cm$^3$. In an embodiment of the present invention the gate electrode can be a metal gate electrode, such as but not limited to, tungsten, tantalum, titanium, and their nitrides or alloys of various metallic systems. In an embodiment of the present invention the gate electrode is formed from a material having a work function between 3.9-5.3 eV. It is to be appreciated, the gate electrode 324 need not necessarily be a single material and can be a composite stack of thin films, such as but not limited to a polycrystalline silicon/metal electrode or a metal/polycrystalline silicon electrode.

Tri-gate transistor 300 has a source region 330 and a drain region 332. Source region 330 and drain region 332 are formed in semiconductor body 308 on opposite sides of gate electrode 324 as shown in FIG. 3A. The source region 330 and the drain region 332 are formed of the same conductivity type such as N-type or P-type conductivity. In an embodiment of the present invention source region 330 and drain region 332 have a doping concentration of between $1 \times 10^{19}$ and $1 \times 10^{21}$ atoms/cm$^3$. Source region 330 and drain region 332 can be formed of uniform concentration or can include subregions of different concentrations or doping profiles such as tip regions (e.g., source/drain extensions). In an embodiment of the present invention when transistor 300 is a symmetrical transistor, source region 330 and drain region 332 will have the same doping concentration and profile. In an embodiment of the present invention when tri-gate transistor 300 is formed as an asymmetric transistor then the doping concentration and profile of the source region 330 and the drain region 332 may vary in order to obtain a particular electrical characteristic.

The portion of semiconductor body 308 located between source region 330 and drain region 332, defines the channel region 350 of transistor 300. The channel region 350 can also be defined as the area of the semiconductor body 308 surrounded by the gate electrode 324. At times however, the source/drain region may extend slightly beneath the gate electrode through, for example, diffusion to define a channel region slightly smaller than the gate electrode length (Lg). In an embodiment of the present invention channel region 350 is intrinsic or undoped monocrystalline silicon. In an embodiment of the present invention, channel region 350 is doped monocrystalline silicon. When channel region 350 is doped it is typically doped to a conductivity level of between $1 \times 10^{16}$ to $1 \times 10^{19}$ atoms/cm3. In an embodiment of the present invention, when the channel region is doped it is typically doped to the opposite conductivity type of the source region 330 and the drain region 332. For example, when the source and drain regions are N-type conductivity the channel region would be doped to p type conductivity. Similarly, when the source and drain regions are P type conductivity the channel region would be N-type conductivity. In this manner a tri-gate transistor 300 can be formed into either a NMOS transistor or a PMOS transistor respectively. Channel region 350 can be uniformly doped or can be doped non-uniformly or with differing concentrations to provide particular electrical and performance characteristics. For example, channel regions 350 can include well-known "halo" regions, if desired.

By providing a gate dielectric and a gate electrode which surrounds the semiconductor body on three sides, the tri-gate transistor is characterized in having three channels and three gates, one (g1) which extends between the source and drain regions on side 312 of silicon body 308, a second (g2) which extends between the source and drain regions on the top surface 316 of silicon body 308, and the third (g3) which extends between the source and drain regions on the sidewall 310 of silicon body 308 as shown in FIG. 3A and FIG. 3B. The gate "width" (Gw) of transistor 300 is the sum of the widths of the three channel regions. That is, the gate width of transistor 300 is equal to the height 320 of silicon body 308 at sidewall 310, plus the width of silicon body of 308 at the top surface 316, plus the height 320 of silicon body 308 at sidewall 312. Larger "width" transistors can be obtained by using multiple devices coupled together (e.g., multiple silicon bodies 308 surrounded by a single gate electrode 324 as shown in FIG. 3A).

As stated above the gate "width" of transistor 300 is equal to the sum of the three gate width created from semiconductor body 308 of transistor 300. In order to fabricate the transistors with larger gate widths, transistor 300 can include an additional or multiple semiconductor bodies or fingers 308 as shown in FIG. 3A. Each semiconductor body 308 has a gate dielectric layer 322 formed on its top surface and sidewalls as shown in FIG. 3A and FIG. 3B. Gate electrode 324 is formed on and adjacent to each gate dielectric 322 on each of the semiconductor bodies 308. Each semiconductor body 308 also includes a source region 330 and a drain region 332 formed in the semiconductor body 308 on opposite sides of gate electrode 324 as shown in FIG. 3A. In an embodiment of the present invention each semiconductor body 308 is formed with the same width and height (thickness) as the other semiconductor bodies 308. In an embodiment of the present invention each source regions 330 and drain regions 332 of the semiconductor bodies 308 are electrically coupled together by the semiconductor material used to form semiconductor body 308 to form a source landing pad 460 and a drain landing pad 480 as shown in FIG. 3A. Alternatively, the source regions 330 and drain regions 332 can be coupled together by higher levels of metalization (e.g., metal 1, metal 2, metal 3 . . . ) used to electrically interconnect various transistors 300 together into functional circuits. The gate width of transistor 300 as shown in FIG. 3A would be equal to the sum of the gate width created by each of the semiconductor bodies 308. In this way, the tri-gate transistor 300 can be formed with any gate width desired.

Additionally, as shown in FIG. 3A and FIG. 3B, the tri-gate device of the present invention includes a film 360 which imparts a stress to the channel region 350 of the device. By applying a proper stress to the channel region, the mobility of the carriers (i.e., electrons or holes) for the device can be increased and the device performance improved. In an embodiment of the present invention, stress incorporating film 360 is formed on and around exposed portions of semiconductor body 308 as shown in FIG. 3A and FIG. 3B. Additionally, in an embodiment of the present invention, the stress incorporating film 360 is formed over and around the gate electrode 324. In an embodiment of the present invention, the stress incorporating film 360 is formed directly on exposed top portion 322 of silicon body 308 as well as directly on or adjacent to sides 310 and 312 of semiconductor body 360. Additionally, in an embodiment of the present invention, the stress incorporating film 360 is also formed directly on and adjacent to gate electrode 324.

Additionally, in an embodiment of the present invention, the stress incorporating film 360 is also formed directly beneath the bottom surface 318 of semiconductor body 308 including beneath the channel region 350 of the semiconductor body 308 as shown in FIG. 3A and FIG. 3B. The stress incorporating film can be formed beneath the semiconductor body or bodies by first removing a portion of the barried oxide or insulator 306 beneath the semiconductor body and then back filling the region with a stress incorporating film. By including a stress incorporating film directly beneath the bottom surface of the channel region 350 of semiconductor bodies 308, the stress material 360 completely surrounds the channel and provides stress from all side of the channel and not just the top.

In an embodiment of the present invention, the film 360 has a compressive stress so that the semiconductor body and especially the channel region of the semiconductor body is under a tensile stress. A channel region under a tensile stress improves the mobility of electrons and therefore is ideal for use in a NMOS device where the carriers are electrons. In an embodiment of the present invention, the stress incorporating film 360 is a film having suitable compressive stress to produce a tensile stress between 0.5-5.0 GPa and ideally about 1 GPa in the channel region of the semiconductor body. In an embodiment of the present invention, the stress incorporating film 360 has a thickness between 10-200 nanometers. In an embodiment of the present invention, the stress film 360 improves carrier mobility by 20-80 percent.

In an embodiment of the present invention, the film 360 has a tensile stress so that the semiconductor body 308 and especially the channel region 350 of the semiconductor body is under a compressive stress. A channel region under a compressive stress improves the mobility of holes and therefore is ideal for use in a PMOS device where the carriers are holes. In an embodiment of the present invention, the film 360 is a film having a suitable tensile stress to produce a compressive stress between 0.5-5.0 GPa in the channel region of the silicon body 308. In an embodiment of the present invention, the thin film 360 is a silicon nitride film having a tensile stress.

In an embodiment of the present invention, a thin oxide or passivating film 319 is formed on the underside 318 of the semiconductor bodies in order to help reduce parasitic leakage effects. In an embodiment of the present invention, the passivating film 319 includes $SiO_2$ and can be formed to a thickness greater than about 1 nanometer.

Because the channel region 350 is surrounded on three sides by gate electrode 324 and gate dielectric 322, transistor 300 can be operated in a fully depleted manner wherein when transistor 300 is turned "on" the channel region 350 fully depletes thereby providing the advantageous electrical characteristics and performance of a fully depleted transistor. That is, when transistor 300 is turned "ON" a depletion region is formed in channel region 350 along with an inversion layer at the surfaces of region 350 (i.e., an inversion layer is formed on the side surfaces and top surface of the semiconductor body). The inversion layer has the same conductivity type as the source and drain regions and forms a conductive channel between the source and drain regions to allow current to flow therebetween. The depletion region depletes free carriers from beneath the inversion layer. The depletion region extends to the bottom of channel region 350, thus the transistor can be said to be a "fully depleted" transistor. Fully depleted transistors have improved electrical performance characteristics over non-fully depleted or partially depleted transistors. For example, operating transistor 300 in a fully depleted manner, gives transistor 300 an ideal or very steep subthreshold slope. The tri-gate transistor can be fabricated with very steep sub-threshold slope of less than 80 mV/decade, and ideally about 60 mV/decade even when fabricated with semiconductor body thicknesses of less than 30 nm. Additionally, operating transistor 300 in the fully depleted manner, transistor 300 has an improved drain induced barrier (DIBL) low in effect which provides for better "OFF" state leakage which results in lower leakage and thereby lower power consumption. In an embodiment of the present invention the tri-gate transistor 300 has a DIBL effect of less than 100 mV/V and ideally less than 40 mV/V.

Figure 6:
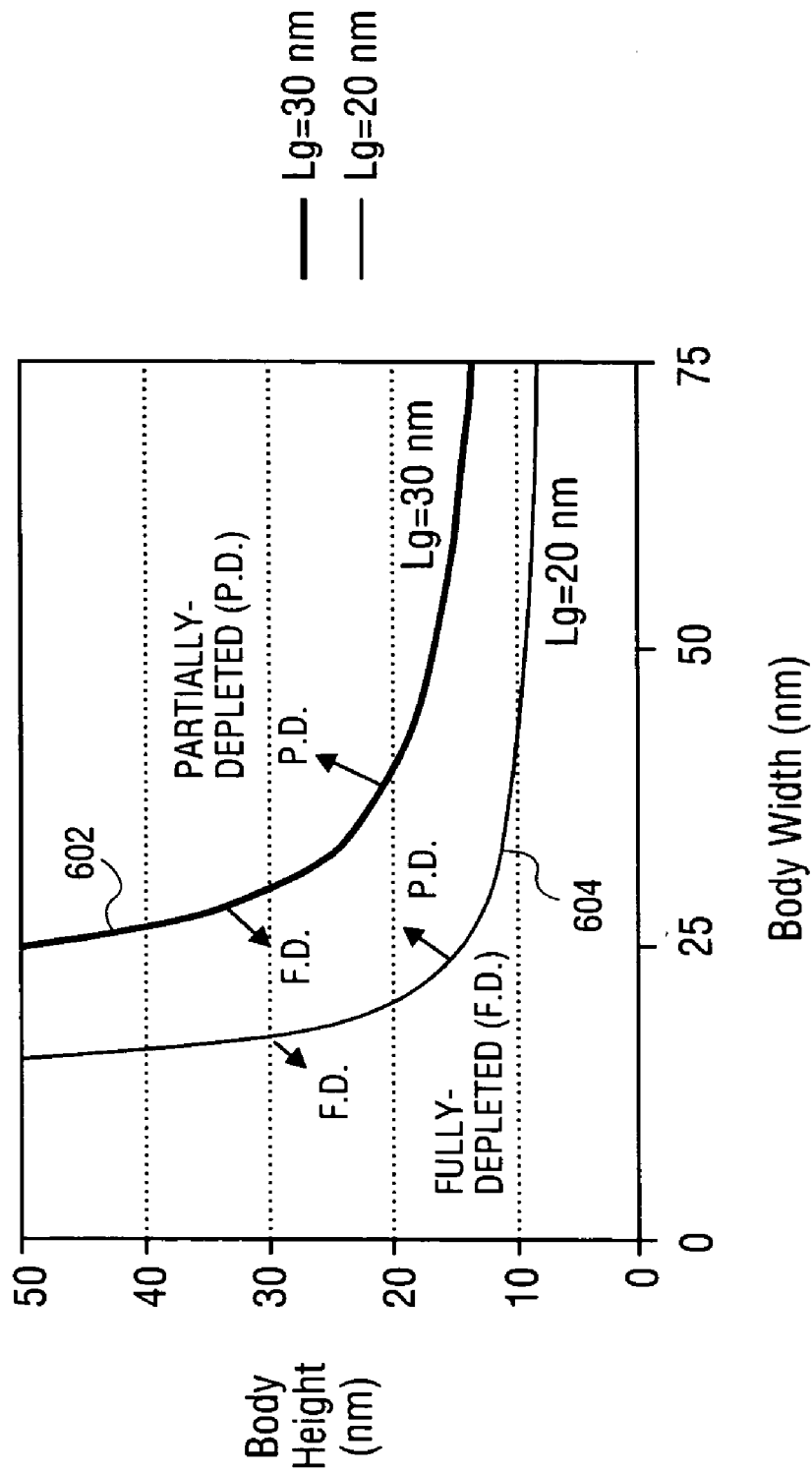
FIG. 6 is a plot which illustrates body heights and body widths which can be used to obtain partially depleted and fully depleted tri-gate transistors having gate lengths (Lg) of 30 nm and 20 nm.

FIG. 6 is an illustration of two plots 602 and 604 which set forth the body height and body width which will produce either fully depleted (F.D) or partially depleted (P.D) tri-gate transistors having gate length (Lg) of 30 nm (602) and 20 nm (604) respectively. In an embodiment of the present invention, the body height, body width and gate length are chosen to have dimensions in which a fully depleted transistor will be formed. In other embodiments, the tri-gate transistor has a body height, body width and gate length such that a partially depleted transistor is formed.

The tri-gate transistor of the present invention can be said to be a non-planar transistor because the inversion layer of the channel region 350 is formed in both the horizontal and vertical directions in semiconductor body 308. The semiconductor device of the present invention can also be considered a non-planar device because the electric field from the gate electrode 324 is applied from both horizontal (g2) and vertical sides (g1 and g3).

Figure 4:
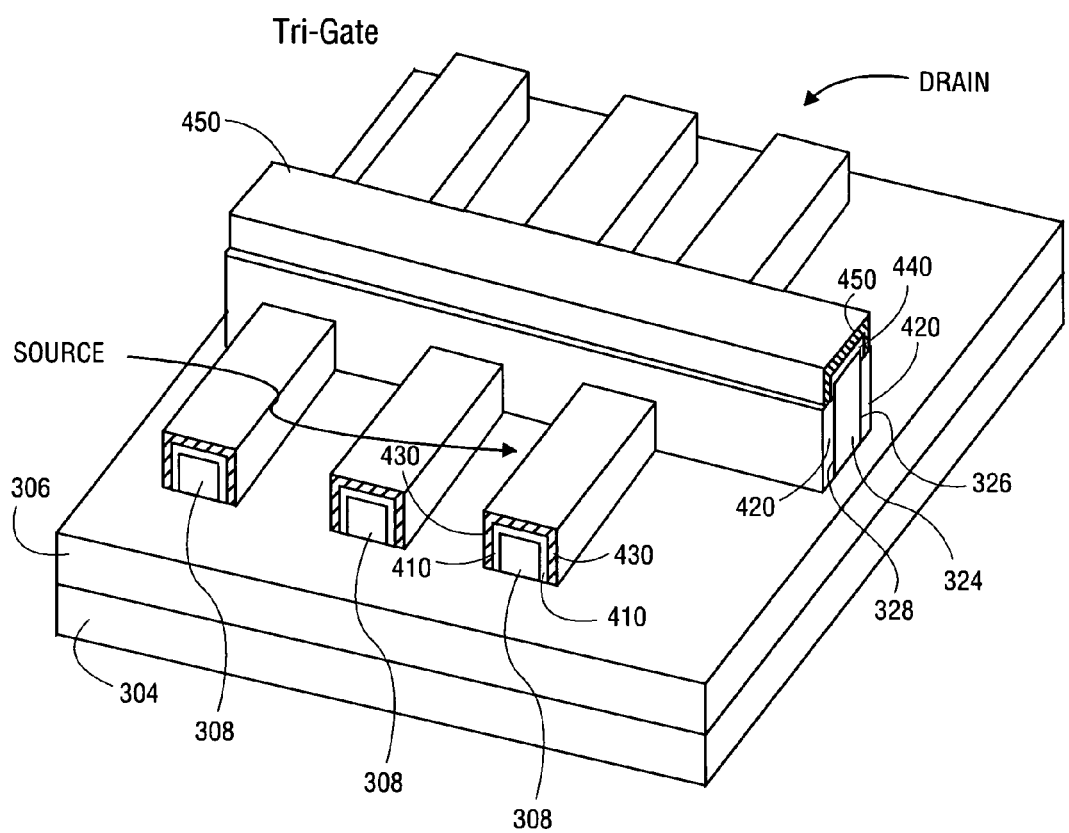
FIG. 4 is an illustration of a tri-gate transistor in accordance with an embodiment of the present invention.

In an embodiment of the present invention tri-gate transistor 300 can include other films or features, such as a silicon or other semiconductor film 410, sidewall spacer 420 and silicide 430 formed prior to forming the stress incorporating film 360 as shown in FIG. 4. For example, in an embodiment of the present invention a semiconductor film 410 is formed on the source region 330 and on the drain region 332 of semiconductor body 308 to form "raised" source and drain regions. Semiconductor film 410 can be a silicon film or a silicon alloy such as silicon germanium ($Si_xGe_y$). In an embodiment of the present invention the semiconductor film 410 is a single crystalline silicon film formed of the same conductivity type as the source region 330 and drain region 332. In an embodiment of the present invention the semiconductor film can be a silicon alloy such as silicon germanium wherein silicon comprises approximately 1 to 99 atomic percent of the alloy. The semiconductor film 410 need not necessarily be a single crystalline semiconductor film and in an embodiment can be a polycrystalline film. Semiconductor film 410 can be electrically isolated from a gate electrode 324 by a pair of dielectric sidewall spacers 420 such as silicon nitride or silicon oxide or composites thereof. Sidewall spacers 420 run along the laterally opposite sidewalls 326 and 328 of gate electrode 324 as shown in FIG. 4 thereby isolating the semiconductor film 410 from gate electrode 324 as shown in FIG. 4. An embodiment of the present invention sidewalls spacers 420 have a thickness of between 20-200 Å. By adding a silicon or semiconductor film to the source and drain regions 330 and 332 of the semiconductor body and forming "raised" source and drain regions, the thickness of the source and drain regions is increased thereby reducing the source/drain contact resistance to transistor 300 and improving its electrical characteristics and performance.

In an embodiment of the present invention a suicide film 430, such as, but not limited to, titanium silicide, nickel silicide, and cobalt silicide is formed on the source region 330 and drain region 332. In an embodiment of the present invention silicide film 430 is formed on a silicon film 410 of silicon body 308 as shown in FIG. 4. Silicide film 430 however can also be formed directly onto the top surface 316 of silicon body 308. For example, silicide film 430 can be formed on silicon body 308 by first forming a silicon film such as an undoped silicon film and a silicon body and then completely consuming the silicon film during the silicide process. Dielectric spacers 420 enable silicide film 430 to be formed on semiconductor body 308 or silicon film 410 in a self-aligned process (i.e., a salicide process).

Additionally, in the embodiment of the present invention a semiconductor or silicon film 440 can also be formed on the top of gate electrode 324 as can a silicide film 450. Silicide film 450 and silicon film 440 are typically formed at the same time as silicide film 430 and silicon film 410 on silicon body 308. The formation of a silicon film 440 on silicide film 450 on the gate electrode reduces the contact resistance to the gate thereby improving the electrical performance of transistor 300.

Figure 5A:
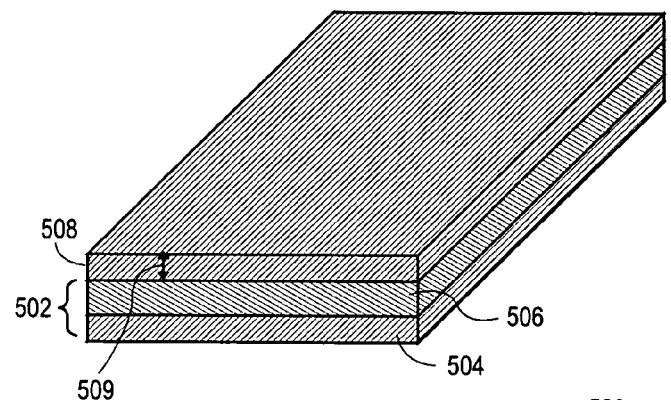
FIGS. 5A-5E illustrate methods of fabricating a tri-gate transistor with a stress incorporation film in accordance with embodiments of the present invention.

A method of fabricating a tri-gate transistor in accordance with embodiments of the present invention is illustrated in FIGS. 5A-5E. The fabrication of a tri-gate transistor begins with substrate 502. A silicon or semiconductor film 508 is formed on substrate 502 as shown in FIG. 5A. In an embodiment of the present invention, the substrate 502 is an insulating substrate, such as shown in FIG. 5A. In an embodiment of the present invention, insulating substrate 502 includes a lower monocrystalline silicon substrate 504 and a top insulating layer 506, such as a silicon dioxide film or silicon nitride film. Insulating layer 506 isolates semiconductor film 508 from substrate 504, and in an embodiment is formed to a thickness between 200-2000 Å. Insulating layer 506 is sometimes referred to as a "buried oxide" layer. When a silicon or semiconductor film 508 is formed on an insulating substrate 502, a silicon or semiconductor on insulating (SOI) substrate 500 is created. In other embodiments of the present invention, the substrate 502 can be a semiconductor substrate, such as but not limited to a silicon monocrystalline substrate and a gallium arsenide substrate.

Although semiconductor film 508 is ideally a silicon film, in other embodiments it can be other types of semiconductor films in which carrier mobility can be enhanced when under stress, such as but not limited to a silicon germanium alloy ($Si_xGe_y$) with less than 25% Ge, and III-V materials such as, gallium arsenide (GaAs), InSb, GaP and GaSb. In an embodiment of the present invention, semiconductor film 508 is an intrinsic (i.e., undoped) silicon film. In other embodiments, semiconductor film 508 is doped to a p type or n type conductivity with a concentration level between $1\times10^{16}$-$1\times10^{19}$ atoms/cm$^3$. Semiconductor film 508 can be insitu doped (i.e., doped while it is deposited) or doped after it is formed on substrate 502 by for example ion-implantation. Doping after formation enables both PMOS and NMOS tri-gate devices to be fabricated easily on the same insulating substrate. The doping level of the semiconductor body at this point determines the doping level of the channel region of the device.

Semiconductor film 508 is formed to a thickness which is approximately equal to the height desired for the subsequently formed semiconductor body or bodies of the fabricated tri-gate transistor. In an embodiment of the present invention, semiconductor film 508 has a thickness or height 509 of less than 30 nanometers and ideally less than 20 nanometers. In an embodiment of the present invention, semiconductor film 508 is formed to the thickness approximately equal to the gate "length" desired of the fabricated tri-gate transistor. In an embodiment of the present invention, semiconductor film 508 is formed thicker than desired gate length of the device. In an embodiment of the present invention, semiconductor film 508 is formed to a thickness which will enable the fabricated tri-gate transistor to be operated in a fully depleted manner for its designed gate length (Lg).

Semiconductor film 508 can be formed on insulating substrate 502 in any well-known method. In one method of forming a silicon on insulator substrate, known as the SIMOX technique, oxygen atoms are implanted at a high dose into a single crystalline silicon substrate and then annealed to form the buried oxide 506 within the substrate. The portion of the single crystalline silicon substrate above the buried oxide becomes the silicon film 508. Another technique currently used to form SOI substrates is an epitaxial silicon film transfer technique which is generally referred to as bonded SOI. In this technique a first silicon wafer has a thin oxide grown on its surface that will later serve as the buried oxide 506 in the SOI structure. Next, a high dose hydrogen implant is made into the first silicon wafer to form a high stress region below the silicon surface of the first wafer. This first Wafer is then flipped over and bonded to the surface of a second silicon wafer. The first wafer is then cleaved along the high stress plain created by the hydrogen implant. This results in a SOI structure with a thin silicon layer on top, the buried oxide underneath all on top of the single crystalline silicon substrate. Well-known smoothing techniques, such as HC smoothing or chemical mechanical polishing (CMP) can be used to smooth the top surface of semiconductor film 508 to its desired thickness.

At this time, if desired, isolation regions (not shown) can be formed into SOI substrate 502 in order to isolate the various transistors to be formed therein from one another. Isolation regions can be formed by etching away portions of the substrate film 508 surrounding a tri-gate transistor, by for example well-known photolithographic and etching techniques, and then back filling the etched regions with an insulating film, such as $SiO_2$.

Figure 5B:
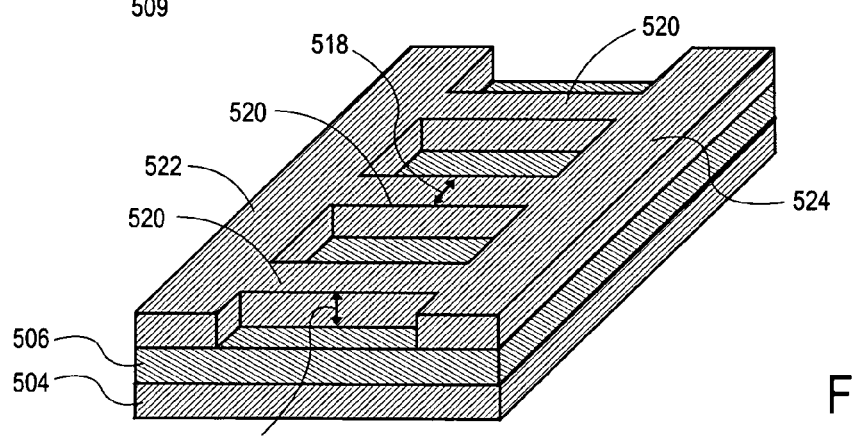

Next, standard photolithography and etching techniques are used to define semiconductor bodies or fins 520 in the semiconductor film 508 for the tri-gate transistor as shown in FIG. 5B. In an embodiment of the present invention, the fins or bodies 520 are patterned to have a width 518 which is equal to or greater than the width desired of the gate length (Lg) of the fabricated transistor. In this way, the most stringent photolithography constraints used to fabricate the transistor are associated with the gate electrode patterning and not the semiconductor body or fin definition. In an embodiment of the present invention, the semiconductor bodies or fins will have a width 518 less than or equal to 30 nanometers and ideally less than or equal to 20 nanometers. In an embodiment of the present invention, the semiconductor bodies or fins have a width 518 approximately equal to the silicon body height 509. In an embodiment of the present invention, the fins or bodies 520 have a width 518 which is between ½ the semiconductor body height 509 and two times the semiconductor body height 509.

Additionally, as shown in FIG. 5B, the photolithography and etching step can also be used to form source landing pads 522 and drain landing pads 524 from the semiconductor film. The landing pads can be used to connect together the various source regions and to connect together the various drain regions of the fabricated transistor.

The semiconductor film 508 can be patterned into fins and landing pads utilizing well known photolithography and etching techniques which generally include the formation of a photoresist mask by masking, exposing, and developing a blanket deposited photoresist film as is well known in the art, and then etching semiconductor film in alignment with the photoresist mask to form one or more silicon bodies or fins 520 and source and drain landing pads 522 and 524 respectively. Semiconductor film 508 is etched until the underlying buried oxide layer 506 is exposed. Well-known semiconductor etching techniques, such as anisotropic plasma etching or reactive ion etching can be used to etch semiconductor film 508 in alignment with the photoresist mask. After semiconductor film 508 is etched to form semiconductor bodies or fins 520 (and source/drain landing pads 522 and 524, if desired) the photoresist mask is removed by well-known techniques, such as by chemical stripping and O2 ashing, to produce the substrate shown in FIG. 5B.

Next, a gate dielectric layer 526 is formed on and around each semiconductor body 520. That is, a gate dielectric layer 526 is formed on the top surface 527 of each of the semiconductor bodies 520 as well as on the laterally opposite sidewalls 528 and 529 of each of the semiconductor bodies 520. The gate dielectric can be a deposited dielectric or a grown dielectric. In an embodiment of the present invention, the gate dielectric layer 526 is a silicon dioxide dielectric film grown with a dry/wet oxidation process. In an embodiment of the present invention, the silicon oxide film is grown to a thickness of between 5-15 Å. In an embodiment of the present invention, the gate dielectric film 526 is a deposited dielectric, such as but not limited to a high dielectric constant film, such as metal oxide dielectric, such as tantalum pentaoxide ($Ta_2O_5$), titanium oxide ($TiO_2$), hafnium oxide ($HfO_2$), $HfSiO_xN_y$, zirconium oxide ($ZrO_2$) and lanthanum oxide $LaO_2$) or other high-K dielectrics, such as PZT and BST. A high dielectric constant film can be formed by any well-known technique, such as by chemical vapor deposition (CVD).

Figure 5C:
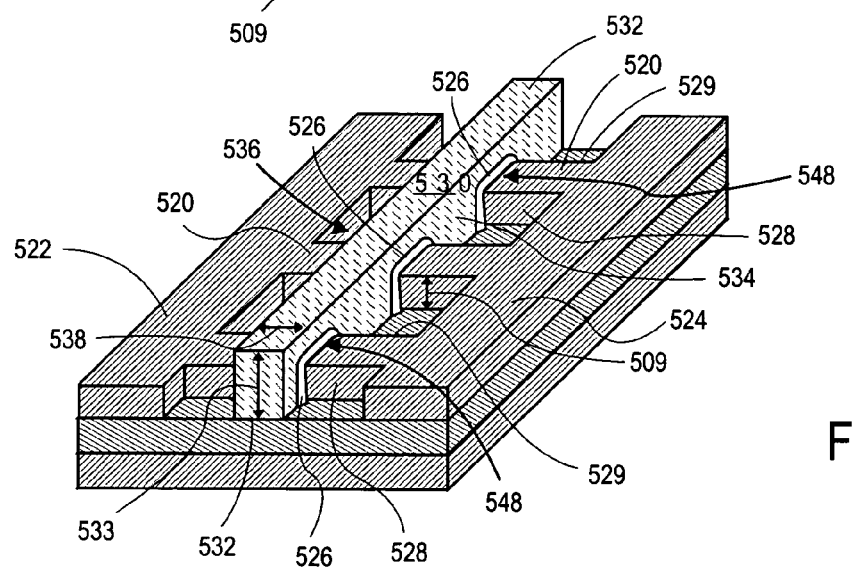
Figure 5D:
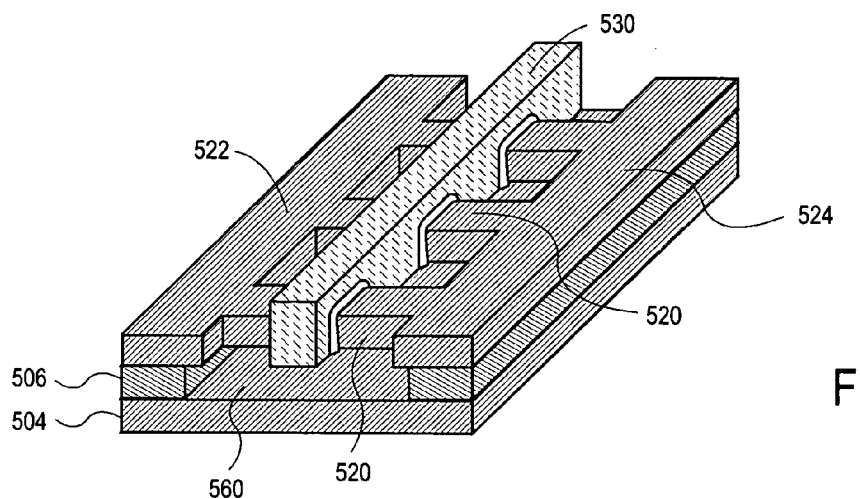
Figure 5E:
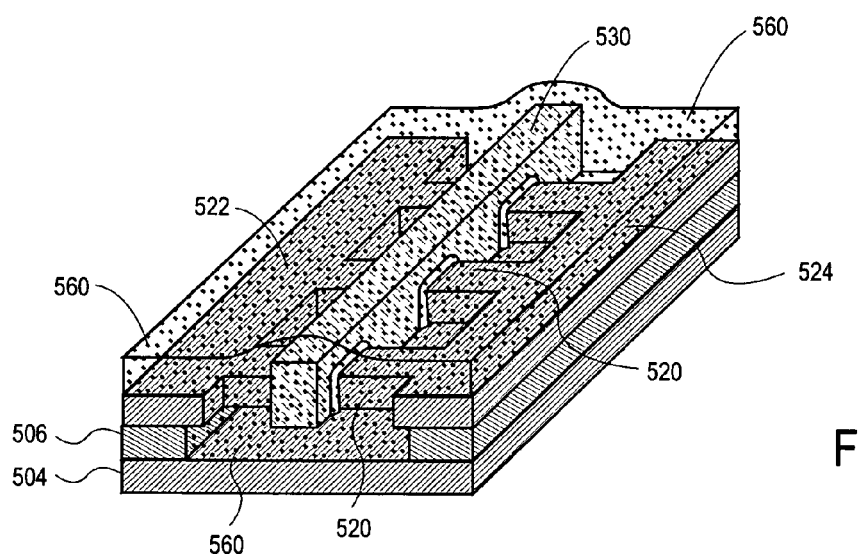

Next, as also shown in FIG. 5C, a gate electrode 530 is formed. The gate electrode 530 is formed on the gate dielectric layer 526 formed on the top surface 527 of each of the semiconductor bodies 520 and is formed on or adjacent to the gate dielectric 526 formed on or adjacent to the sidewalls 528 and 529 of each of the semiconductor bodies as shown in FIG. 5E. The gate electrode 530 has a top surface 532 opposite of bottom surface formed on the insulating substrate 502 and has a pair of laterally opposite sidewalls 534 and 536. The distance between the laterally opposite sidewalls 534 and 536 defines the gate length (Lg) 538 of the tri-gate transistor. Gate electrode 530 can be formed by blanket depositing a suitable gate electrode material over the substrate and then patterning the material into an electrode 530. The gate electrode can be formed to a thickness 533 between 200-3000 Å. In an embodiment the gate electrode has a thickness or height 533 of at least three times the height 509 of semiconductor bodies 520. The gate electrode material is then patterned with well-known photolithography and etching techniques to form gate electrode 530 from the gate electrode material. In an embodiment of the present invention, the gate electrode material comprises polycrystalline silicon. In another embodiment of the present invention, the gate electrode material comprises a polycrystalline silicon germanium alloy. In yet other embodiment of the present invention, the gate electrode material can comprise a metal film, such as tungsten, tantalum, and their nitrides. Gate electrode 530 can be formed by well-known techniques, such as by blanket depositing a gate electrode material over the substrate of FIG. 5B and then patterning the gate electrode material with well-known photolithography and etching techniques. In an embodiment of the present invention, the photolithography process used to define gate electrode 530 utilizes the minimum or smallest dimension lithography process used to fabricate the tri-gate transistor. (That is, in an embodiment of the present invention, the gate length (Lg) 538 of gate electrode 530 has a minimum feature dimension of the transistor defined by photolithography.) In an embodiment of the present invention, the gate length 538 is less than or equal to 30 nanometers and ideally less than or equal to 20 nanometers.

Next, source and drain regions for the transistor are formed in semiconductor body 520 on opposite sides of gate electrode 530. In an embodiment of the present invention, the source and drain regions include tip or source/drain extension regions. Source and drain extension regions 540 and 542, respectively, can be formed by placing dopants 544 into semiconductor bodies 520 on both sides 532, 534 of gate electrode 530 in order to form tip regions 540 and 542 as shown in FIG. 5D. For a PMOS tri-gate transistor, the semiconductor fins or bodies 520 are doped to a p type conductivity and to a concentration between $1\times10^{20}$-$1\times10^{21}$ atoms/$cm^3$. For a NMOS tri-gate transistor, the semiconductor fins or bodies 520 is doped with n type conductivity ions to a concentration between $1\times10^{20}$-$1\times10^{21}$ atoms/$cm^3$. In an embodiment of the present invention, the silicon films are doped by ion-implantation. In an embodiment of the present invention, the ion-implantation occurs in a vertical direction (i.e., a direction perpendicular to substrate 502). When gate electrode 530 is a polysilicon gate electrode, it can be doped during the ion-implantation process. Gate electrode 530 acts as a mask to prevent the ion-implantation step from doping the channel region(s) 548 of the tri-gate transistor. The channel region 548 is the portion of the silicon body 520 located beneath or surrounded by the gate electrode 530. If gate electrode 530 is a metal electrode, a dielectric hard mask maybe used to block the doping during the ion-implantation process. In other embodiments, other methods, such as solid source diffusion, may be used to dope the semiconductor body to form source and drain extensions.

In embodiments of the present invention, "halo" regions can be formed in the silicon body prior to the formation of source/drain regions or source/drain extension regions. Halo regions are doped regions formed in the channel region 548 of the device and are of the same conductivity but of a slightly higher concentration than the doping of the channel region of the device. Halo regions can be formed by ion-implanting dopants beneath the gate electrode by utilizing large angled ion-implantation techniques.

Next, if desired, the substrate shown in FIG. 5C can be further processed to form additional features, such as heavily doped source/drain contact regions, deposited silicon on the source and drain regions to form raised source and drain regions, as well as the gate electrode, and the formation of silicide on the source/drain contact regions as well as on the gate electrode.

Next, as shown in FIG. 5D, the buried oxide layer 506 located underneath and adjacent to the semiconductor fins or bodies is removed to form an air gap 560 in the buried oxide layer. The buried oxide layer can be removed by using a selective etch which preferencely etches the buried insulating film without substantially etching away the semiconductor body. When the semiconductor bodies are silicon and the buried insulating layer 506 is a silicon oxide, the buried silicon oxide layer can be selectively etched away with a buffered HF etchant. It is to be appreciated that any suitable wet or dry etch technique which can selectively etch away the buried insulating layer without etching away the semiconductor body may be utilized to form air gaps 560. An etchant with a selectivity of greater than 10 is desirable.

The buried insulator etch can be performed on the wafer with or without a patterning layer depending upon the layout of the device. Typically a patterned photoresist mask will be utilized which exposes the transistors which are to receive the subsequent stress film and covers those transistors which are not to include a stress film.

In an embodiment of the present invention, after the removal of the buried insulating film from beneath the semiconductor fins or bodies, a short oxidation or passivation step can be performed to passivate the bottom of the exposed fins in order to reduce parasitic leakage effects. Any suitable oxidation or passivation process can be used to form the passivating dielectric. In an embodiment of the present invention, the bottom of the fins are passivated by $SiO_2$ to form a passivating oxide film having a thickness greater than about 1 nanometer.

After the underlying insulating film 506 is removed and passivation or oxidation complete, a filling step of the stress incorporation film 560 can begin. The stress incorporation film 560 must be an insulating film in order to prevent shorts from the source to the drain. The purpose of the stress incorporation film is to provide stress in the channel region of the device. The type of stress in the stress incorporation film depends upon the type of device being fabricated. For a NMOS device where the carriers are electrons, the channel regions need to be under tensile stress to increase mobility of electrons. In order to place the channel region under tensile stress, the stress incorporation film 560 needs to be a compressive film. Additionally, the process used to form the stress incorporation film 560 should be a conformal process, such as a vapor phase deposition, which can blanket deposit the film equally on vertical and horizontal surfaces and be able to fill underneath the semiconductor bodies. It is desirable that the stress incorporation film be able to completely fill the regions underneath the fins or bodies of the device. This can be facilitated by making narrower fins or making the underlying insulating film layer 506 thicker in order to improve the aspect ratio of the fill under the channel regions. In an embodiment of the present invention, the stress incorporation film is a compressive silicon nitride film. In an embodiment of the present invention, an NMOS device is fabricated with a compressive silicon nitride film formed by chemical vapor deposition (CVD) utilizing a reactant gas mixture comprising dichloro-silane (DCS) and ammonia ($NH_3$). BTBAS can also be used in place of DCS. Such a process will blanket deposit a silicon nitride film over the substrate with equal deposition on horizontal and vertical surfaces and enable the filling of the air gap beneath the silicon bodies.

For a PMOS device where the carriers are holes, the channel regions needs to be in compression to increase the mobility of the holes. In order to place the channel in compression, the stress incorporation film needs to be a tensile film. In an embodiment of the present invention, the stress incorporation film is a tensile silicon nitride film.

In an embodiment of the present invention, the stress incorporation film is formed to a thickness sufficient to completely fill the air gap regions beneath the semiconductor bodies and channel region and completely surround the semiconductor body and gate electrode as shown in FIG. 5E. The stress incorporation film completely surrounds the device and provides stress over a large area resulting in the desired stress in the channel to improve mobility. Additionally, in embodiments of the present invention, the film stress properties are modulated during deposition in order to optimize the film for device performance.

After deposition is completed, a masking and etch step can be used to remove the stress incorporation film from areas where it is not desired, and processing continued in a normal manner to form "back end" features, such as metal interconnects and interlayer dielectrics to electrically couple the individual transistors together into a functional circuit.

Thus, a novel non-planar device with a stress incorporation film and its method of fabrication have been described.

We claim:

1. A semiconductor device comprising:
a semiconductor body having a top surface and laterally opposite sidewalls formed on a substrate;
a gate dielectric formed on said laterally opposite sidewalls of said semiconductor body;
a gate electrode formed over said top surface of said semiconductor body and adjacent to said gate dielectric on said laterally opposite sidewalls of said semiconductor body; and
a film formed beneath said semiconductor body wherein said film produces a stress in said semiconductor body.

2. The device of claim 1, further comprising an oxide layer disposed between said semiconductor body and said film.

3. The device of claim 1, further comprising an insulating layer formed between said top surface of said semiconductor body and said gate electrode formed over said top surface of said semiconductor body.

4. The device of claim 1, wherein said film is to have stress.

5. A semiconductor device comprising:
a semiconductor body formed on a substrate;
a gate dielectric formed on and around said semiconductor body;
a gate electrode formed on and around said gate dielectric formed on and around said semiconductor body; and
a film formed adjacent to and beneath said semiconductor body wherein said film produces a stress in said semiconductor body.

6. The device of claim 5, wherein said film produces a tensile stress in said semiconductor body.

7. The device of claim 5, wherein said film produces a compressive stress in said semiconductor body.

8. A semiconductor device comprising:
a semiconductor body having a top surface and laterally Opposite sidewalls formed on a substrate;
a gate dielectric formed on said laterally opposite sidewalls of said semiconductor body;
a gate electrode formed over said top surface of said semiconductor body and adjacent to said gate dielectric on said laterally opposite sidewalls of said semiconductor body; and
a film formed on a source and drain region formed in said semiconductor body and beneath said semiconductor body wherein said film produces a stress in said semiconductor body.

9. The device of claim 8, wherein said source and drain region are N-type conductivity.

10. The device of claim 8, wherein said source and drain region are P type conductivity.

11. A semiconductor device comprising:
a semiconductor body formed on a substrate;
a gate dielectric formed on and around three sides of said semiconductor body;
a gate electrode formed on and around said gate dielectric formed on and around said three sides of said semiconductor body;
a source region and a drain region formed in said semiconductor body on opposite sides of said gate electrode; and
a film formed on exposed portions of said source region and said drain region formed in said semiconductor body and beneath a portion of a bottom surface of said semiconductor body to produce a stress in said semiconductor body.

12. The device of claim 11, wherein said source region comprises a raised source region and said drain region comprises a raised drain region.

13. A semiconductor device comprising:
a semiconductor material formed on a substrate; said semiconductor material forming semiconductor bodies and a source landing pad and a drain landing pad, said semiconductor bodies electrically coupled together by said source landing pad and said drain landing pad;
a gate dielectric form 2J on and around each of said semiconductor bodies;
a gate electrode formed on and around each of said gate dielectrics; and
a film formed on said source landing pad and said drain landing pad and beneath said semiconductor bodies, said film producing a stress in said semiconductor material forming said semiconductor bodies and said source landing pad and said drain landing pad.

14. The device of claim 13, wherein said substrate comprises an insulating substrate.

15. The device of claim 13, wherein said film is a silicon nitride film.

* * * * *

UNITED STATES PATENT AND TRADEMARK OFFICE
CERTIFICATE OF CORRECTION

| | | |
|---|---|---|
| PATENT NO. | : 7,714,397 B2 | |
| APPLICATION NO. | : 11/493789 | |
| DATED | : May 11, 2010 | |
| INVENTOR(S) | : Hareland et al. | |

It is certified that error appears in the above-identified patent and that said Letters Patent is hereby corrected as shown below:

In column 14, at line 52 delete, "form 2J" and insert --formed--.

Signed and Sealed this
Twenty-ninth Day of March, 2011

David J. Kappos
*Director of the United States Patent and Trademark Office*